United States Patent [19]

En

[11] 4,193,062

[45] Mar. 11, 1980

[54] TRIPLE RANDOM ERROR CORRECTING CONVOLUTIONAL CODE

[75] Inventor: John En, San Diego, Calif.

[73] Assignee: Cubic Corporation, San Diego, Calif.

[21] Appl. No.: 920,173

[22] Filed: Jun. 29, 1978

[51] Int. Cl.² .......................................... G06F 11/12
[52] U.S. Cl. ................................................... 371/43
[58] Field of Search ............ 340/146.1 AQ, 146.1 AL

[56] References Cited

U.S. PATENT DOCUMENTS

| | | | |
|---|---|---|---|
| 3,227,999 | 1/1966 | Hagelbarger | 340/146.1 AQ |
| 3,402,393 | 9/1968 | Massey | 340/146.1 AQ |
| 3,571,795 | 3/1971 | Tong | 340/146.1 AQ |
| 3,605,090 | 9/1971 | Burton | 340/146.1 AQ |
| 3,728,678 | 4/1973 | Tong | 340/146.1 AQ |
| 3,873,971 | 3/1975 | En | 340/146.1 AQ |

Primary Examiner—Charles E. Atkinson
Attorney, Agent, or Firm—Brown & Martin

[57] ABSTRACT

Disclosed are methods and apparatus for transmitting information bits in a new error correcting code. Also disclosed are methods and apparatus for recovering the transmitted information bits after they have been received with errors. Utilizing the disclosed methods and apparatus, up to three errors in any twenty-six consecutive bits may be corrected. To encode the information bits for transmission, one parity bit is generated for each information bit. Each parity bit is a function of six information bits. To detect and correct an erroneously received information bit, thirteen received information bits and thirteen received parity bits are examined.

15 Claims, 4 Drawing Figures

EQ.1 $P_K = I_K + I_{K-1} + I_{K-2} + I_{K-3} + I_{K-5} + I_{K-12}$

EQ.2 $I'_K = I_K + e^i_K$ ←—ERROR BIT = "1" IF ERROR IN TRANSMISSION

EQ.3 $P'_K = P_K + e^p_K$ ←—ERROR BIT = "1" IF ERROR IN TRANSMISSION

| | BITS IN ERROR | EQUATIONS 11-16 THAT EQUAL "1" | SUM OF EQS. 11-16 |
|---|---|---|---|
| ROW 1 | $e^i_{K-12}$ | 11,12,13,14,15,16 | 6 |
| ROW 2 | $e^i_{K-12}$, $e^i_{K-11}$ | 11,12,13,14,—,16 | 5 |
| ROW 3 | $e^i_{K-12}$, $e^i_{K-11}$, $e^i_{K-10}$ | 11,—,13,14,—,16 | 4 |
| ROW 4 | NO ERRORS | —,—,—,—,—,— | 0 |
| ROW 5 | $e^i_{K-11}$ | —,—,—,—,15,— | 1 |
| ROW 6 | $e^i_{K-11}$, $e^i_{K-10}$ | —,12,—,—,15,— | 2 |
| ROW 7 | $e^i_{K-11}$, $e^i_{K-10}$, $e^i_{K-9}$ | —,12,13,—,15,— | 3 |
| ROW 8 | $e^i_{K-11}$, $e^i_{K-10}$, $e^i_{K-9}$, $e^i_{K-7}$ | 11,12,13,—,15,— | 4 |

Fig. 4

TRIPLE RANDOM ERROR CORRECTING CONVOLUTIONAL CODE

BACKGROUND OF THE INVENTION

This invention relates to error correcting codes, and more particularly to methods and apparatus for implementing such codes. Basically, the function of an error correcting code is to allow information bits to be recovered after they have been transmitted through a medium which randomly causes errors in some of the bits.

To do this, the information bits that are to be transmitted are used to generate parity bits. Then the information bits and parity bits are both transmitted through the error causing medium. Due to this transmission, some of the transmitted information bits and the transmitted parity bits are received with random errors. However, based on the error correcting code, the originally transmitted information bits may be recovered from the erroneously received information bits and parity bits.

These codes have a variety of applications. For example, when digital information is transmitted through the air, it quite often is encoded in with an error correcting code. This is because the transmission media has noise, and this causes errors during transmission. Thus, when the information is received, the error correcting code allows the original information to be recovered, even though some of the bits were received in error.

In the prior art, a variety of error correcting codes exist. See, for example, Golay, M. J. E., "Binary Coding", IRE Transactions on Information Theory, IT-4, PP. 23–28, September, 1954. Also see, for example, Townsend R. L. and Weldon, Jr., E. J., "Self-Orthogonal Quasi-Cycle Codes" IEEE Transactions on Information Theory, IT-13, April, 1967.

These and other codes, however, are substantially different than the disclosed code. For example, the Golay code requires complex decoding methods and apparatus; while in comparison, the disclosed code uses very simple decoding methods and apparatus. Also, by comparison, the Townsend code has a different error correcting capability. It guarantees to correct 3 errors out of 36 consecutive bits; whereas the disclosed code guarantees to correct 3 errors out of 26 consecutive bits.

Therefore, it is one object of the invention to provide an improved method of encoding information in an error correcting code.

Another object of the invention is to provide an improved method of decoding transmitting information in an error correcting code.

Another object of the invention is to provide improved apparatus for encoding information in an error correcting code.

Still another object of the invention is to provide improved apparatus for decoding transmitted information from received encoded information having random errors.

SUMMARY OF THE INVENTION

These and other objects are accomplished in accordance with the invention by the following methods and apparatus. To transmit information bits $I_K$ where K equals 1, 2, 3, ..., a parity bit $P_K$ is generated for each of these information bits. This parity bit is a modulo 2 sums of information bits $I_K$, $I_{K-1}$, $I_{K-2}$, $I_{K-3}$, $I_{K-5}$, and $I_{K-12}$. Both the information bits $I_K$ and parity bits $P_K$ are transmitted as the encoded bit stream. Preferably, the information bits $I_K$ and corresponding parity bits $P_K$ are transmitted sequentially.

These information bits and parity bits are received as bits $I_K'$ and $P_K'$ respectively. In order to recover the originally transmitted information bits $I_K$, a syndrome bit $S_K$ is generated for each of the received information bits $I_K'$. Syndrome bit $S_K$ is the modulo 2 sum of $P_K'$, $I_K'$, $I_{K-1}'$, $I_{K-2}'$, $I_{K-3}'$, $I_{K-5}'$, and $I_{K-12}'$. Further, modulo 2 sums X1, X2, X3, and X4 are generated from the syndrome bits. X1 is the modulo 2 sum of $S_K$ and $S_{K-2}$. X2 is the modulo 2 sum of $S_{K-3}$, $S_{K-4}$, and $S_{K-7}$. X3 is the modulo 2 sum of $S_{K-5}$, $S_{K-6}$, and $S_{K-10}$, and X4 is the modulo 2 sum of $S_{K-8}$ and $S_{K-9}$.

Based on the modulo 2 sums X1 through X4 and the syndrome bits, the received information bits $I_{K-12}$ are corrected. Specifically, the received bits $I_{K-12}'$ are corrected when more than 3 of the quantities X1, X2, X3, X4, $S_{K-11}$, and $S_{K-12}$ equal 1.

Also described are apparatus for carrying out the above described steps. Further this apparatus includes circuitry which operates to insure that abnormal error patterns are not infinitely propagated whenever any 26 consecutively received information bits and code bits contain more than three errors.

BRIEF DESCRIPTION OF THE DRAWING

Various preferred methods and embodiments of the invention disclosed herein will best be understood by reference to the DETAILED DESCRIPTION when read in conjunction with the following drawings, wherein:

FIG. 3 is a set of equations which help explain the operation of the apparatus in FIGS. 1 and 2.

FIG. 4 contains a table of information which further explains the operation of the FIG. 2 apparatus.

DETAILED DESCRIPTION

Figure 1:
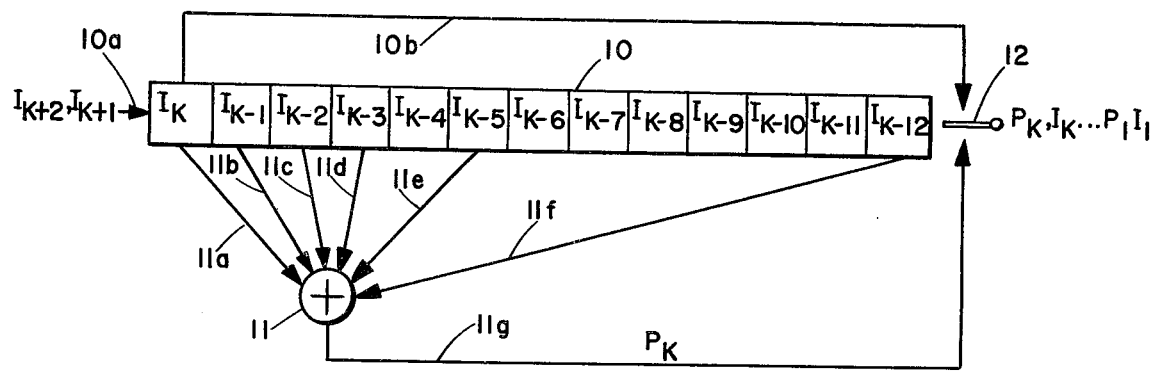
FIG. 1 is a logic drawing of apparatus for encoding information bits in an error correcting code according to the invention.

A preferred method and apparatus for encoding information bits $I_K$ in an error correcting code where K equals 1, 2, 3, ... will now be described in conjunction with FIG. 1. Basically, the preferred embodiment therein illustrated includes a digital shift register 10, a modulo 2 adder 11, and a switching circuit 12. In operation, information bits $I_K$ are serially loaded into register 10 via an input lead 10a. There, they are shifted through the various stages of the register. Register 10 has thirteen stages. At the time instant illustrated, these stages contain information bits $I_K$, $I_{K-1}$, $I_{K-2}$, ... $I_{K-12}$.

Adder 11 has inputs 11a–11f connected respectively to the first, second, third, fourth, sixth, and thirteenth stage of register 10. Accordingly, adder 11 operates to perform a modulo 2 sum of information bits $I_K$, $I_{K-1}$, $I_{K-2}$, $I_{K-3}$, $I_{K-5}$, and $I_{K-12}$. This sum is generated on a lead 11g; and it is herein designated as parity bit $P_K$. This parity bit is represented mathematically by equation 1 of FIG. 3.

One preferred form of this code is illustrated by the sequence at the output of switch 12. As therein illustrated, first information bit $I_1$ is transmitted, then parity bit $P_1$ is transmitted, then information bit $I_2$ is transmitted, then parity bit $P_2$ is transmitted, etc. To implement this preferred form of the code, an information bit is loaded into register 10; and then switch 12 sequentially passes information bit $I_K$ on lead 10b and parity bit $P_K$ on lead 11g. Then another information bit $I_{K+1}$ is loaded into register 10; and switch 12 passes bits $I_{K+1}$ and $P_{K+1}$. This sequence is repeated for each pair of the information bits and parity bits to be transmitted.

Figure 2:
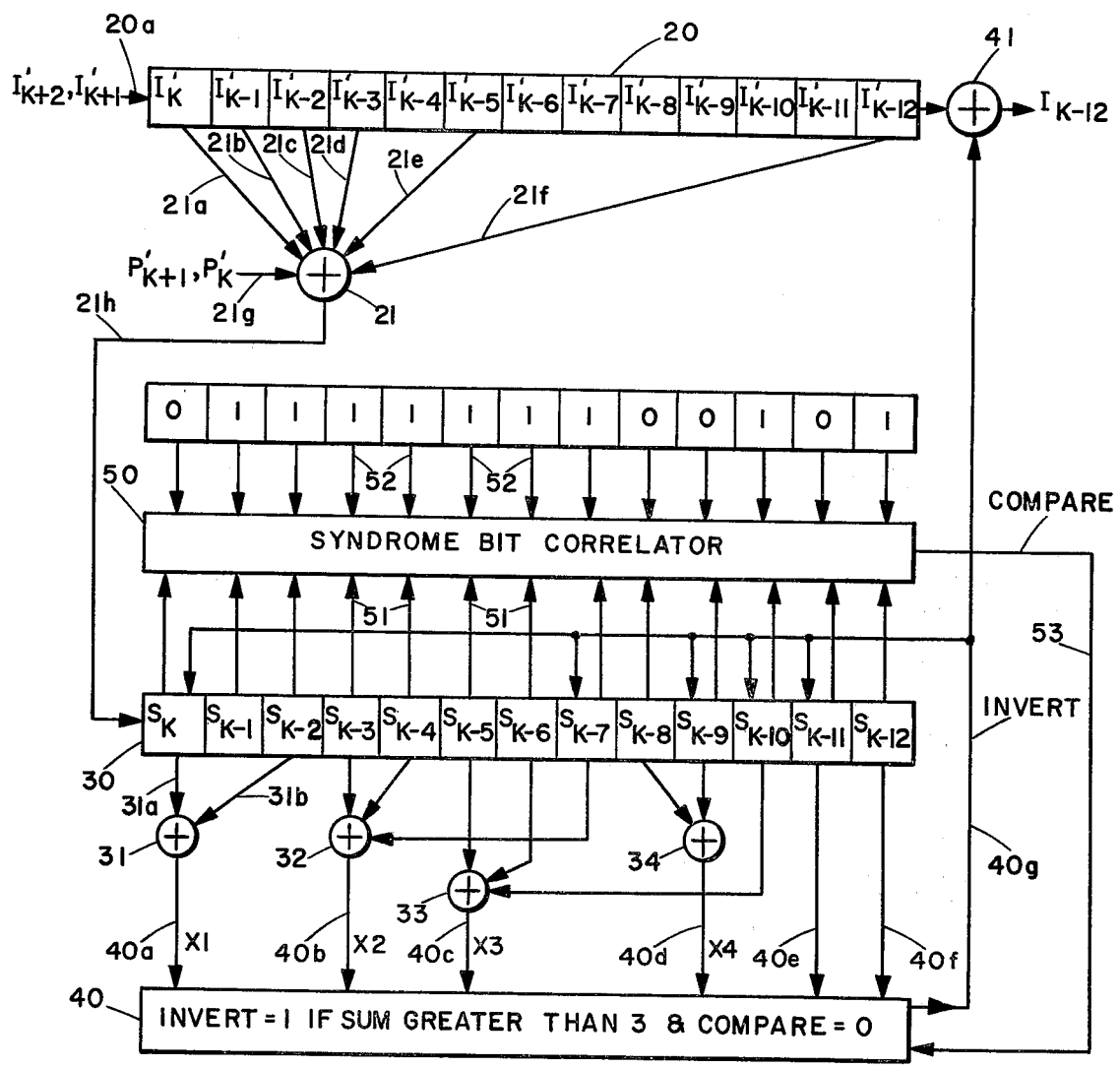
FIG. 2 is a logic diagram of apparatus for decoding transmitted information bits from received information bits and received parity bits according to the invention.
Figure 3:
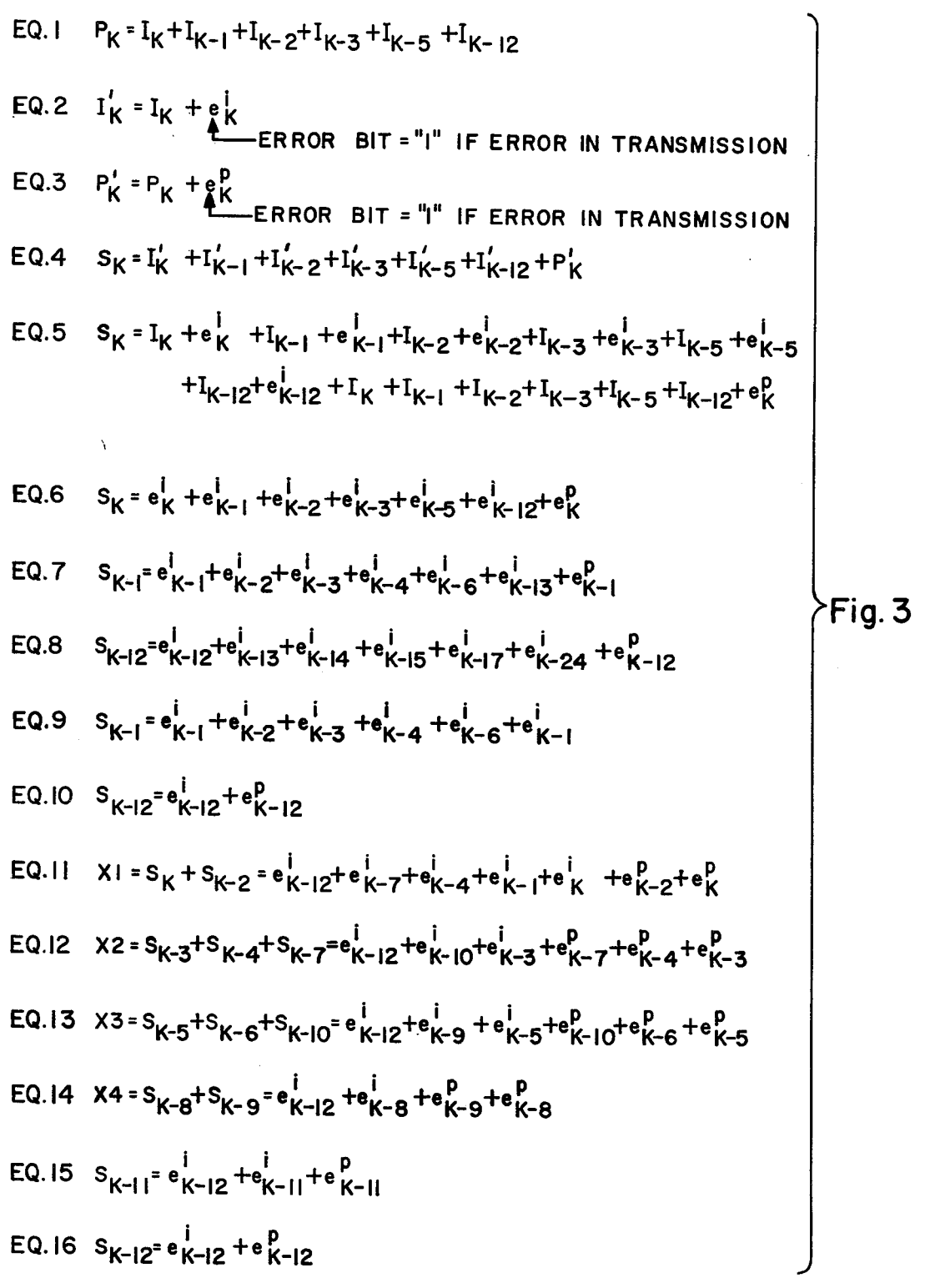

Referring now to FIGS. 2 and 3, a preferred method and apparatus for decoding the transmitted information bits $I_K$ from received information bits $I_K'$ and received code bits $P_K'$ will be described. In this description, signal $I_K'$ represents signal $I_K$ plus a random error bit $e_K^i$. This relation is represented mathematically by equation 2. If an error occurred in the transmission of signal $I_K$, then the error bit equals 1; otherwise, it equals 0. Also in this description, $P_K'$ represents the received code bit $P_K$ plus a random error bit $e_K^p$. If an error occured in the transmission of signal $P_K$, then this error bit equals 1; otherwise it equals 0. This relation is represented mathematically by equation 3.

One step in the decoding process is to generate a syndrome bit $S_K$ for each of the received information bits $I_K'$. Syndrome $S_K$ is the modulo 2 sum of the received bits $P_K'$, $I_K'$, $I_{K-2}'$, $I_{K-3}'$, $I_{K-5}'$, and $I_{K-12}'$. This is represented mathematically in equation 4.

A shift register 20 and a modulo 2 adder 21 are included in the FIG. 2 apparatus to form these syndrome bits. Shift register 20 has an input 20a; and it is thirteen stages long. All of the received information bits are serially loaded into and shifted through this register. At the time instant illustrated in FIG. 2, register 20 contains information bits $I_K'$, $I_{K-1}'$, ... $I_{K-12}'$.

Adder 21 had inputs 21a–21f coupled respectively to the first, second, third, fourth, sixth, and thirteenth stage of register 20. Adder 21 also has an input of 21g; and the received parity bits $P_K'$ are applied to this input. Accordingly, adder 21 generates modulo 2 sums as defined previously by equation 4. These sums are generated on an output lead 21h as signals $S_K$.

As described above, signals $S_K$ are the sum of the received information bits and received parity bits. However, these signals may also be rewritten in terms of the transmitted information bits, transmitted parity bits, and respective error bits. Such rewriting is performed by substituting equation 2 and equation 3 into equation 4. The result of this substitution is shown in FIG. 3 as equation 5.

Note that in equation 5, many of the various terms appear twice. For example, the term $I_K$ appears twice. Each of the terms which appear twice can be cancelled because the plus signs in equation 5 represent modulo 2 arithmatic. In other words, if signal $I_K$ equals 1, then $I_K$ plus $I_K$ equals 0; and if signal $I_K$ equals 0, then signal $I_K$ plus $I_K$ also equals 0.

Equation 6 gives the expression for signal $S_K$ after all of the duplicate terms in equation 5 have been cancelled. This equation will be very useful in describing the remaining steps of the decoding method and the operation of the remaining portion of the FIG. 2 apparatus.

Basically, the next step in the decoding method consists of forming modulo 2 sums X1, X2, X3 and X4. Sum X1 is the modulo 2 sum of $S_K$ and $S_{K-2}$. Sum X2 is the modulo 2 sum of $S_{K-3}$, $S_{K-4}$, and $S_{K-7}$. Sum X3 is the modulo 2 sum of $S_{K-5}$, $S_{K-6}$, and $S_{K-10}$. And, sum X4 is the modulo 2 sum of $S_{K-8}$ and $S_{K-9}$.

To form these sums, and also to save syndrome bits $S_{K-11}$ and $S_{K-12}$ which will be used later, the disclosed decoder includes a shift register 30 and modulo 2 adders 31–34. Register 30 has an input coupled to lead 21h for receiving signals $S_K$. This register is thirteen stages long. The outputs of this register are summed in various combinations as illustrated in FIG. 2 to form the above described sums X1–X4. For example, adder 31 has inputs of 31a and 31b respectively coupled to receive signals $S_K$ and $S_{K-2}$ to thereby generate signal X1.

Each of the modulo 2 sum signals X1–X4 as described above is in terms of the syndrome signals. However, to further explain the operation of the FIG. 2 apparatus, it is necessary to rewrite signals X1–X4 in terms of the error signals which comprise these syndrome signals. This is easily performed with the use of equation 6. For example, to express signals $S_{K-1}$ in terms of various error signals, it is only necessary to substitute K-1 for K in equation 6. The result of this substitution is given by equation 7. All of the other syndrome signals may also be expressed in terms of their component error signals by a similar substitution. For example, syndrome $S_{K-12}$ is expressed in terms of its component error signals by substituting K-12 for K in equation 6. The result is given as equation 8.

Inspection of equations 7 and 8 shows that they contain error terms which occurred in bits prior to $I_{K-12}$ and $P_{K-12}$. For example, equation 8 contains the error term $e^i_{K-24}$. All such error terms can be set to 0 if the assumption is made that no errors occurred prior to the transmission of bits $I_{K-12}$ and $P_{K-12}$. They may be also set to 0 if the assumption is made that if such errors did occur, they and their associated syndrome sums were corrected by the illustrated apparatus. This is a good assumption, because, as will be shown later, such prior errors and their corresponding syndrome sums are in fact corrected.

Using the above assumptions, equations 7 and 8 can be simplified as indicated by equations 9 and 10 respectively. Of course, similar simplified expressions can be written for syndromes $S_{K-2}$, $S_{K-3}$, ... $S_{K-11}$.

Simplified expressions for the syndrome bits, such as equations 9 and 10, can now be used to write corresponding simplified expressions for the modulo 2 sums X1–X4. The resulting expressions are listed as equations 11–14. Also listed are equations 15 and 16 which are simplified expressions for the syndrome bits $S_{K-11}$ and $S_{K-12}$. These will be used as described below.

By inspection of equations 11–16, it can be seen that the error term $e^i_{K-12}$ appears once in each equation; while each of the other error terms appear only once throughout all of the equations. Such equations are called orthogonal on $e^i_{K-12}$. This property of orthogonality permits the solution for $e^i_{K-12}$ if not more than three of the error terms present in equations 11–16 equal one.

FIG. 4 contains information which demonstrates how this orthogonality property permits the solution of error bit $e^i_{K-12}$. Suppose for example, that only one of the bits represented by equations 11–16 is in error; and that this error occurred in the information bit K-12. Under these conditions, each of the equations 11–16 will equal 1. Thus, the arithmatic sum of equations 11–16 equals six. These conditions are listed in Row 1.

In comparison, assume that two of the bits represented by the terms in equations 11–16 are in error. Suppose for example, that the information bits K-11 and K-12 are in error. Under these conditions, equations 11, 12, 13, 14 and 16 equal 1. Thus, the arithmatic sum of equations 11–16 equals five. This information is listed in Row 2.

Similarly, in Row 3, it is assumed that information bits K-10, K-11, and K-12 are in error. As a result, the arithmetic sum of equations 11–16 equals four. By similar analysis, it can be shown that all other possible combinations of an error in information bit K-12, plus no more than two other errors will also yield an arithmetic sum of equations 11–16 which is greater than three. Thus, a sum of equations 11–16 which is greater than three, unambiguously indicates that an error occurred in information bit K-12.

Conversely, a sum of equations 11–16 that equals three or less indicates that no error occurred in information bit K-12. This is demonstrated in FIG. 4 by the data in Rows 4, 5, 6, 7. These examples respectively represent conditions where no errors occur, one error occurs, two errors occurs, and three errors occur in bits other than information bit K-12.

FIG. 4 also contains information that demonstrates why the disclosed code is limited to guarantee its error correcting ability to situations where no more than three of the terms in equations 11–16 equal 1. In the particular illustrated example, information bits K-7, K-9, K-10 and K-11 are all assumed to be in error. As a result, equations 11, 12, 13 and 15 equal 1; and thus their sum equals 4. Hence, an ambiguity occurs in that it cannot be determined from the sum of equation 11–16 as to whether information bit K-12 is in error, or whether four other bits are in error. No such ambiguity occurs, however, if the number of error terms in equations 11–16 which simultaneously equal 1 is less than or equal to 3.

Based on the above, in order to correct the received information bit K-12, it is only necessary to invert that bit on the condition that more than three of the terms X1, X2, X3, X4, $S_{K-11}$ and $S_{K-12}$ equal 1. In the illustrated preferred embodiment, this conditional correction is performed by circuits 40, and 41. Suitably, circuit 40 includes a known arithmatic adder having inputs 40a–40f. The output of this adder is compared by a known comparator in circuit 40 to determine if the sum is greater than three. If the sum is not greater than three, then the output signal INVERT of circuit 40 is forced to a 0. This allows bit $I_{K-12}'$ to pass through adder 41 without inversion. Conversely, if the sum is greater than three, the received information bit $I_{K-12}'$ is inverted by adder 41. This inversion is performed in response to circuit 40 generating the INVERT signal on output lead 40g equal to 1.

The INVERT signal is also sent to shift register 30. In particular, it is sent to the first, eighth, tenth, eleventh, and twelfth stage of that register. This is because the syndrome signals held by these stages are a function of the error term $e^i_{K-12}$. Equation 6, for example, illustrated how syndrome signal $S_K$ depends upon this error term. Thus, the INVERT signal is fed back to the above listed stages to invert the syndrome bit held therein. After this inversion, the resulting syndrome bit is the same as if no error occurred in information bit K-12. Therefore, the assumption previously made in order to simplify equations 7 and 8 as equations 9 and 10 is a valid assumption. A point which remains to be considered is whether there are any adverse effects in the FIG. 2 circuit when more than three of the terms in equations 11–16 equal 1. Specifically, there remains the question of whether an erroneously generated INVERT signal on lead 40g will cause the error terms in equations 11–16 to be infinitely propagated. All of the various error patterns have been examined for possible infinite error propagation. In this examination, it has been found that only one pattern of the syndrome bits will propagate errors indefinately through the feedback lead 40g. This syndrome pattern is 0111111100101.

Thus, to eliminate such error propagation, there is included in the FIG. 2 circuit, a syndrome bit correlator 50. This correlator has inputs 51 and 52 for respectively receiving the syndrome bits $S_K$ through $S_{K-12}$ and the above described syndrome bit pattern. These two quantities are compared in correlator 50; and an output signal COMPARE is generated on an output lead 53 when the quantities are equal. In response to the COMPARE signal, circuit 40 inhibits the INVERT feedback signal on lead 40g. Thus, when the next syndrome bit is entered into register 30, the above described bit pattern will be shifted by one bit position. This shifted pattern is not capable of generating infinite errors.

Preferred methods for transmitting and decoding information bits in an error correcting code according to the invention have now been described in detail. Further, preferred apparatus for transmitting and decoding information bits in an error correcting code according to the invention have also been described in detail. In addition, various changes and modifications may be made to the above described details without departing from the nature and spirit of the invention. Therefore, it is to be understood that the invention is not limited to said details, but is defined by the appended claims.

Having described my invention, I now claim:

1. A method of transmitting information bits $I_K$ in an encoded bit stream where K=1, 2, 3, . . ., comprised of the steps of:
generating a parity bit $P_K$ for each of said information bits $I_K$ where $P_K$ is the modulo 2 sum of information bits $I_K$, $I_{K-1}$, $I_{K-2}$, $I_{K-3}$, $I_{K-5}$ and $I_{K-12}$; and
transmitting both said information bits $I_K$ and said parity bits $P_K$ as said encoded bit stream.

2. A method according to claim 1, wherein one of said information bits $I_K$ and a corresponding parity bit $P_K$ are transmitted sequentially.

3. A method of decoding transmitted information bits $I_K$ from received information bits $I_K'$ and received parity bits $P_K'$ where $I_K'$ equals $I_K$ plus a random error bit $e_K^i$, $P_K'$ equals transmitted parity bit $P_K$ plus a random error bit $e_K^p$, and K=1, 2, . . . comprised of the steps of:
generating a syndrome bit $S_K$ for each of said received bits $I_K'$, where $S_K$ is the modulo 2 sum of received bits $P_K'$, $I_K'$, $I_{K-1}'$, $I_{K-2}'$, $I_{K-3}'$, $I_{K-5}'$, and $I_{K-12}'$,
forming the modulo 2 sums $X1=S_K+S_{K-2}$, $X2=S_{K-3}+S_{K-4}+S_{K-7}$, $X3=S_{K-5}+S_{K-6}+S_{K-10}$, $X4=S_{K-8}+S_{K-9}$ and,
inverting bit $I_{K-12}'$ on the condition that more than three of said modulo 2 sums X1, X2, X3, X4, $S_{K-11}$ and $S_{K-12}$ equal one.

4. A method according to claim 3, wherein said inverting step is performed by adding quantities X1, X2, X3, X4, S1 and S2; and by inverting bit $I_{K-12}'$ if the sum is greater than three.

5. A method according to claim 3, wherein after one of said information bits $I_K'$ and the corresponding parity bit $P_K'$ are received, then bit $I_{K-12}'$ is inverted as per said condition before additional information bits and parity bits are received.

6. A method according to claim 5, and further including the step of inverting syndrome bits $S_K$, $S_{K-7}$, $S_{K-9}$, $S_{K-10}$, and $S_{K-11}$ if said condition is met.

7. A method according to claim 6, and further including the step of:
inhibiting said inverting of said syndrome bits when $S_K'$, $S_{K-1}'$ ... $S_{K-12}$ equal 0111111100101.

8. Apparatus for transmitting an encoded bit stream containing information bits $I_K$ where $K=1, 2, \ldots$ comprising:
means for generating a parity bit $P_K$ for each of said information bits $I_K$; where $P_K$ is the modulo 2 sum of information bits $I_K$, $I_{K-1}$, $I_{K-2}$, $I_{K-3}$, $I_{K-5}$, and $I_{K-12}$; and
means for transmitting both said information bits $I_K$ and said parity bits $P_K$ as said encoded bit stream.

9. Apparatus according to claim 8, wherein said means for generating includes a thirteen bit shift register, means for receiving and shifting said information bits $I_K$, and means for forming a modulo 2 sum of bits $I_K$, $I_{K-1}$, $I_{K-2}$, $I_{K-3}$, $I_{K-5}$, and $I_{K-12}$ in said shift register means; and wherein said means for transmitting includes switching means for alternately passing said information bits $I_K$ and corresponding parity bits $P_K$.

10. Apparatus for decoding transmitted information bits $I_K$ from received information bits $I_K'$ and received parity bits $P_K'$ where $I_K$ equals $I_K$ plus a random error bit $e^i{}_K'$ $P_K'$ equals $P_K$ plus a random error bit $e^p{}_K'$ and $K=1, 2, \ldots$ comprised of:
means for receiving said bits $I_K'$ and $P_K'$ from an external source;
means for generating, coupled to said means for receiving, for generating a syndrome bit $S_K$ for each of said received bits $I_K'$ where $S_K$ is the modulo 2 sum of received bits $P_K'$, $I_K'$, $I_{K-1}'$ $I_{K-2}'$, $I_{K-3}'$, $I_{K-5}'$ and $I_{K-12}'$;
means for forming, coupled to said means for generating, for forming the modulo 2 sums
$X1 = S_K + S_{K-2}'$     $X2 = S_{K-1} + S_{K-4} + S_{K-7}'$
$X3 = S_{K-5} + S_{K-5} + S_{K-6} + S_{K-10}'$
$X4 = S_{K-8} + S_{K-9}$
means for determining, coupled for said means for forming, for determining when more than three of said modulo 2 sums X1, X2, X3, X4, $S_{K-11}$ and $S_{K-12}$ equal one, and
means for inverting, responsive to said means for determining, for inverting bit $I_{K-12}'$ on the condition that more than three of said modulo 2 sums X1, X2, X3, X4, $S_{K-11}$ and $S_{K-12}$ equal one.

11. Apparatus according to claim 10, wherein said means for determining includes means for adding quantities X1, X2, X3, X4; $S_{K-11}$ and $S_{K-12}$ and means for generating a digital signal indicating if the sum is greater than three.

12. Apparatus according to claim 10, wherein said means for generating includes thirteen bit shift register means for receiving and shifting said bits $I_K'$, and modulo 2 adder means coupled to said shift register means for forming bit $S_K$ from said bits in said shift register means.

13. Apparatus according to claim 10, wherein said means for forming includes thirteen bit shift register means for receiving and shifting said bits $S_K$, and modulo 2 adder means coupled to said shift register means for forming X1, X2, X3 and X4.

14. Apparatus according to claim 10, and further including means for inverting, coupled to said means for determining, for inverting syndrome bits $S_K'$, $S_{K-7}'$, $S_{K-9}'$, $S_{K-10}$, and $S_{K-11}$ when said means for determining determines that more than three of said modulo 2 sums equal one.

15. Apparatus according to claim 14 and further including means for determining is bits $S_K$, $S_{K-1}$, ... $S_{K-12}$ equal 0111111100101, and means for inhibiting said means for inverting said syndrome bits if bits $S_K$, $S_{K-1}$, ... $S_{K-12}$ equal 0111111100101.

* * * * *